United States Patent
Wang et al.

(10) Patent No.: US 10,937,357 B2
(45) Date of Patent: Mar. 2, 2021

(54) GATE DRIVING CIRCUIT, DISPLAY APPARATUS, AND METHOD OF DRIVING GATE DRIVING CIRCUIT

(71) Applicants: BOE TECHNOLOGY GROUP CO., LTD., Beijing (CN); Hefei Xinsheng Optoelectronics Technology Co., Ltd., Anhui (CN)

(72) Inventors: Fei Wang, Beijing (CN); Xiping Wang, Beijing (CN); Rui Ma, Beijing (CN); Xiaoye Ma, Beijing (CN); Zixuan Wang, Beijing (CN)

(73) Assignees: BOE TECHNOLOGY GROUP CO., LTD., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 415 days.

(21) Appl. No.: 15/769,907

(22) PCT Filed: May 8, 2017

(86) PCT No.: PCT/CN2017/083443
§ 371 (c)(1),
(2) Date: Apr. 20, 2018

(87) PCT Pub. No.: WO2018/205090
PCT Pub. Date: Nov. 15, 2018

(65) Prior Publication Data
US 2020/0242998 A1    Jul. 30, 2020

(51) Int. Cl.
*G09G 3/20* (2006.01)
*G11C 19/28* (2006.01)

(52) U.S. Cl.
CPC .......... *G09G 3/2092* (2013.01); *G11C 19/28* (2013.01); *G09G 2310/0267* (2013.01); *G09G 2310/0286* (2013.01)

(58) Field of Classification Search
CPC .............................................. G09G 2310/0286
See application file for complete search history.

(56) References Cited

U.S. PATENT DOCUMENTS

2013/0088265 A1    4/2013   Chen
2015/0042547 A1    2/2015   Kwon et al.
(Continued)

FOREIGN PATENT DOCUMENTS

CN    104332146 A    2/2015
CN    104700789 A    6/2015
(Continued)

OTHER PUBLICATIONS

International Search Report & Written Opinion dated Feb. 9, 2018, regarding PCT/CN2017/083443.
(Continued)

*Primary Examiner* — Robin J Mishler
(74) *Attorney, Agent, or Firm* — Intellectual Valley Law, P.C.

(57) ABSTRACT

The present application discloses a gate driving circuit having multiple shift register units cascaded one after another in multiple stages. The multiple shift register units are grouped into a plurality of groups of shift register units, each of the plurality of groups of shift register units having a plurality of shift register units. Each of the plurality of groups of shift register units includes a single pull-down control sub-circuit.

16 Claims, 11 Drawing Sheets

(56) References Cited

U.S. PATENT DOCUMENTS

2016/0133337 A1    5/2016  Gu
2017/0287428 A1*  10/2017  Xue .................... H01L 27/1214

FOREIGN PATENT DOCUMENTS

| CN | 105185345 A | 12/2015 |
| CN | 106023943 A | 10/2016 |
| CN | 106023945 A | 10/2016 |
| CN | 106297698 A | 1/2017 |
| CN | 106548740 A | 3/2017 |
| CN | 206135862 U | 4/2017 |

OTHER PUBLICATIONS

The Extended European Search Report in the European Patent Application No. 17859370.3, dated Oct. 9, 2020.

* cited by examiner

US 10,937,357 B2

GATE DRIVING CIRCUIT, DISPLAY APPARATUS, AND METHOD OF DRIVING GATE DRIVING CIRCUIT

CROSS-REFERENCE TO RELATED APPLICATION

This application is a national stage application under 35 U.S.C. § 371 of International Application No. PCT/CN2017/083443 filed May 8, 2017, the contents of which are incorporated by reference in the entirety.

TECHNICAL FIELD

The present invention relates to display technology, more particularly, to a gate driving circuit, a display apparatus, and a method of driving a gate driving circuit.

BACKGROUND

Image display apparatuses include a driver for controlling image display in each of a plurality of pixels. The driver is a transistor-based circuit including a gate driving circuit and a data driving circuit. The gate driving circuit is formed by cascading multiple units of shift register units. Each shift register unit outputs a gate driving signal to one of a plurality of gate lines. The gate driving signals from the gate driving circuit scan through gate lines row by row, controlling each row of transistors to be in on/off states. The gate drive circuit can be integrated into a gate on array (GOA) circuit, which can be formed directly in the array substrate of the display panel.

SUMMARY

In one aspect, the present invention provides a gate driving circuit, comprising multiple shift register units cascaded one after another in multiple stages, wherein the multiple shift register units are grouped into a plurality of groups of shift register units, each of the plurality of groups of shift register units comprising a plurality of shift register units; wherein each of the plurality of groups of shift register units comprises a single pull-down control sub-circuit.

Optionally, the single pull-down control sub-circuit is connected to a single high-voltage port, a pull-down node, a pull-up node, and a first low-voltage port; and the single pull-down control sub-circuit is configured to be controlled by a potential level at the pull-up node to pull down a potential level at the pull-down node to a low voltage level.

Optionally, the plurality of groups of shift register units comprise M numbers of groups of shift register units sequentially in an order from m=1 to m=M, 1≤m≤M, M is greater than or equal to 2; a m-th group of shift register units comprises N numbers of shift register units cascaded in series for respectively outputting N numbers of gate scanning signals to respective N numbers of gate lines of a display panel sequentially in an order from n=1 to n=N, wherein 1≤n≤N, N is greater than or equal to 2; one or more input ports connected to the N numbers of shift register units are configured to receive an input signal; one or more reset ports connected to the N numbers of shift register units are configured to receive an output signal from an output port of a shift register unit in a (m+1)-th group of shift register units as a reset signal; and the single pull-down control sub-circuit is connected to the pull-up node in a first shift register unit of the N numbers of shift register units.

Optionally, the input signal is an output signal from an output port of a first shift register unit in a (m−1)-th group of shift register units.

Optionally, the first shift register unit of the N numbers of shift register units is a first stage of the multiple shift register units; and the input signal is a start signal.

Optionally, each of the N numbers of shift register units comprises a pull-up control sub-circuit; and the pull-up control sub-circuit in a n-th shift register unit of the N numbers of shift register units comprises a first transistor having a gate and a first terminal commonly connected to an input port configured to receive the input signal, and a second terminal connected to the pull-up node in the n-th shift register unit.

Optionally, each of the plurality of groups of shift register units comprises a single input port and a single pull-up control sub-circuit; and the single pull-up control sub-circuit comprises a first transistor having a gate and a first terminal commonly connected the single input port configured to receive the input signal, and a second terminal connected to pull-up nodes in the N numbers of shift register units.

Optionally, each of the N numbers of shift register units comprises a reset sub-circuit; the reset sub-circuit in a n-th shift register unit of the N numbers of shift register units is connected to a reset port configured to receive the reset signal, a low-voltage port, and the pull-up node in the n-th shift register unit, and configured to pull down potential levels at the pull-up node in the n-th shift register unit to a low voltage level; and the reset sub-circuit in the n-th shift register unit comprises a second transistor having a gate connected to the reset port, a first terminal connected to the pull-up node in the n-th shift register unit, and a second terminal connected to the low-voltage port.

Optionally, the single pull-down control sub-circuit comprises a ninth transistor having a gate and a first terminal commonly connected to the single high-voltage port, and a second terminal connected to a pull-down connection node; a fifth transistor having a gate connected to the pull-down connection node, a first terminal connected to the single high-voltage port, and a second terminal connected to the pull-down node in the first shift register unit of the N numbers of shift register units; an eighth transistor having a gate connected to the pull-up node in the first shift register unit of the N numbers of shift register units, a first terminal connected to the pull-down connection node, and a second terminal connected to the first low-voltage port; and a sixth transistor having a gate connected to the pull-up node in the first shift register unit of the N numbers of shift register units, a first terminal connected to the pull-down node in the first shift register unit of the N numbers of shift register units, and a second terminal connected to the first low-voltage port.

Optionally, each of the N numbers of shift register units comprises a noise reduction sub-circuit; the noise reduction sub-circuit in a n-th shift register unit of the N numbers of shift register units comprises a tenth transistor having a gate connected to the pull-down node in the first shift register unit of the N numbers of shift register units, a first terminal connected to the pull-up node in the n-th shift register unit, and a second terminal connected to a low-voltage port; and an eleventh transistor having a gate connected to the pull-down node in the first shift register unit of the N numbers of shift register units, a first terminal connected to an output port in the n-th shift register unit, and a second terminal connected to the low-voltage port.

Optionally, each of the N numbers of shift register units comprises a pull-up sub-circuit; the pull-up sub-circuit in a n-th shift register unit of the N numbers of shift register units comprises a third transistor and a capacitor, the third transistor having a gate connected to the pull-up node in the n-th shift register unit, a first terminal connected to a clock input port in the n-th shift register unit, and a second terminal connected to an output port in the n-th shift register unit, the capacitor having first terminal connected to the pull-up node in the n-th shift register unit and a second terminal connected to the output port in the n-th shift register unit; and the pull-up sub-circuit is configured to be controlled by the potential level at the pull-up node in the n-th shift register unit to output a clock signal from the clock input port in the n-th shift register unit to the output port in the n-th shift register unit.

Optionally, $2 \leq N \leq 5$.

Optionally, N=3; each group of the plurality of groups of shift register units comprises a first shift register unit, a second shift register unit, and a third shift register unit; and the one or more reset ports are configured to receive an output signal from an output port of the second shift register unit in a (m+)-th group of shift register units as a reset signal.

In another aspect, the present invention provides a display apparatus comprising the gate driving circuit described herein.

In another aspect, the present invention provides a method of driving a gate driving circuit described herein for respectively generating multiple gate driving signals at respective output ports of multiple shift register units in a plurality of image display cycles; wherein each display cycle includes sequentially a charging period, an output period, a discharging period, a reset period, and a maintaining period; and the single pull-down control sub-circuit is connected to a single high-voltage port, a pull-down node, a pull-up node, and a low-voltage port; the method comprising providing an input signal to the plurality of groups of shift register units through the one or more input ports in the charging period; providing a reset signal to the plurality of groups of shift register units through the one or more reset port in the reset period; controlling the pull-up node to be at a high potential level; and controlling the single pull-down control sub-circuit by the potential level at the pull-up node, to pull down a potential level at the pull-down node to a low voltage level.

Optionally, the plurality of groups of shift register units comprise M numbers of groups of shift register units sequentially in an order from m=1 to m=M, $1 \leq m \leq M$, M is greater than or equal to 2; a m-th group of shift register units comprises N numbers of shift register units cascaded in series for respectively outputting N numbers of gate scanning signals to respective N numbers of gate lines of a display panel sequentially in an order from n=1 to n=N, wherein $1 \leq n \leq N$, N is greater than or equal to 2; the single pull-down control sub-circuit is connected to the pull-up node in a first shift register unit of the N numbers of shift register units; and providing the reset signal to the plurality of groups of shift register units through the one or more reset ports in the reset period comprises providing an output signal from an output port of a shift register unit in a (m+1)-th group of shift register units as the reset signal to the plurality of groups of shift register units through the one or more reset ports in the reset period.

Optionally, providing the input signal to the plurality of groups of shift register units through the one or more input ports in the charging period comprises providing an output signal from an output port of a shift register unit in a (m−1)-th group of shift register units as the input signal to plurality of groups of shift register units through the one or more input ports in the charging period.

Optionally, the first shift register unit of the N numbers of shift register units is a first stage of the multiple shift register units; and providing the input signal to the plurality of groups of shift register units through the one or more input ports in the charging period comprises providing a start signal as the input signal to the plurality of groups of shift register units through the one or more input ports in the charging period.

Optionally, each of the N numbers of shift register units comprises a pull-up control sub-circuit, a reset sub-circuit, a noise reduction sub-circuit, and a pull-up sub-circuit; the pull-up control sub-circuit in a n-th shift register unit of the N numbers of shift register units comprises a first transistor having a gate and a first terminal commonly connected to an input port configured to receive the input signal, and a second terminal connected to the pull-up node in the n-th shift register unit; the reset sub-circuit in a n-th shift register unit of the N numbers of shift register units comprises a second transistor having a gate connected to a reset port configured to receive the reset signal, a first terminal connected to the pull-up node in the n-th shift register unit, and a second terminal connected to a low-voltage port; the single pull-down control sub-circuit comprises a ninth transistor having a gate and a first terminal commonly connected to the single high-voltage port, and a second terminal connected to a pull-down connection node, a fifth transistor having a gate connected to the pull-down connection node, a first terminal connected to the single high-voltage port, and a second terminal connected to the pull-down node in the first shift register unit of the N numbers of shift register units, an eighth transistor having a gate connected to the pull-up node in the first shift register unit of the N numbers of shift register units, a first terminal connected to the pull-down connection node, and a second terminal connected to the first low-voltage port, and a sixth transistor having a gate connected to the pull-up node in the first shift register unit of the N numbers of shift register units, a first terminal connected to the pull-down node in the first shift register unit of the N numbers of shift register units, and a second terminal connected to the first low-voltage port, the noise reduction sub-circuit in a n-th shift register unit of the N numbers of shift register units comprises a tenth transistor having a gate connected to the pull-down node in the first shift register unit of the N numbers of shift register units, a first terminal connected to the pull-up node in the n-th shift register unit, and a second terminal connected to the low-voltage port, and an eleventh transistor having a gate connected to the pull-down node in the first shift register unit of the N numbers of shift register units, a first terminal connected to an output port in the n-th shift register unit, and a second terminal connected to the low-voltage port; and the pull-up sub-circuit in a n-th shift register unit of the N numbers of shift register units comprises a third transistor and a capacitor, the third transistor having a gate connected to the pull-up node in the n-th shift register unit, a first terminal connected to a clock input port in the n-th shift register unit, and a second terminal connected to an output port in the n-th shift register unit, the capacitor having first terminal connected to the pull-up node in the n-th shift register unit and a second terminal connected to the output port in the n-th shift register unit; the method further comprises in the charging period, providing the input signal to the n-th shift register unit through an input port to control the pull-up control sub-circuit in the n-th shift register unit to output a high voltage to the pull-up node in the n-th shift register unit, and controlling the single pull-down control sub-circuit to pull down potential levels at the pull-down node and the pull-down connection node; in the output period, controlling the pull-up control sub-circuit in the n-th shift register unit by a high potential level at the pull-up node in the n-th shift register unit to output a high voltage clock signal from the clock input port in the n-th shift register unit to the output port in the n-th shift register unit, and outputting an output signal from the output port in a first shift register unit in the m-th group of shift register units to an input port in a first shift register unit in the (m+1)-th group of shift register units to start the charging period in the (m+1)-th group of shift register units; in the discharging period, controlling the pull-up sub-circuit in the n-th shift register unit by the high potential level at the pull-up node in the n-th shift register unit to pull down a potential level at the output port in the n-th shift register unit by a low voltage clock signal from the clock input port in the n-th shift register unit; in the reset period, providing an output signal from an output port of a shift register unit in a (m+1)-th group of shift register units as a reset signal to a reset port in the m-th group of shift register units, controlling the reset sub-circuit in the n-th shift register unit by the reset signal to pull down potential levels at the pull-up node and the output port in the n-th shift register unit to a low voltage level, providing a high voltage at the single high-voltage port, and controlling the single pull-down control sub-circuit by the high voltage at the single high-voltage port to pull up a potential level at the pull-down node to a high voltage level; and in the maintaining period, maintaining the potential levels at the pull-up node and the output port in the n-th shift register unit at the low voltage level, and maintaining the potential level at the pull-down node at the high voltage level.

Optionally, in the output period, the high potential level at the pull-up node in the n-th shift register unit is a potential level bootstrapped by the capacitor in the n-th shift register unit; pull-up nodes in the N numbers of shift register units in the m-th group of shift register units are sequentially and non-simultaneously bootstrapped one by one; and high voltage clock signals are outputted from output ports in the N numbers of shift register units in the m-th group of shift register units sequentially and non-simultaneously.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional gate driving circuit, each shift register unit includes a pull-down control sub-circuit, including a fifth transistor M5, a sixth transistor M6, an eighth transistor M8, and a ninth transistor M9. The large number of transistors needed in the gate driving demand a relatively large bezel area and a relatively high power consumption.

Accordingly, the present disclosure provides, inter alia, a gate driving circuit, a display apparatus, and a method of driving a gate driving circuit that substantially obviate one or more of the problems due to limitations and disadvantages of the related art. In one aspect, the present disclosure provides a gate driving circuit. In some embodiments, the gate driving circuit includes multiple shift register units cascaded one after another in multiple stages. The multiple shift register units are grouped into a plurality of groups of shift register units, each of the plurality of groups of shift register units including a plurality of shift register units. Optionally, each of the plurality of groups of shift register units further includes a single pull-down control sub-circuit. Optionally, the single pull-down control sub-circuit is connected to a single high-voltage port, a pull-down node, a pull-up node, and a first low-voltage port (e.g., a single low-voltage port). By having this design, the total number of pull-down control sub-circuits (and the number of transistors) in the gate driving circuit are significantly reduced. A display apparatus having the present gate driving circuit can be made smaller, e.g., having a smaller bezel area as compared to the conventional display apparatuses. Moreover, the display apparatus having the present gate driving circuit has a lower power consumption due to the reduced number of transistors and other components.

Figure 1:
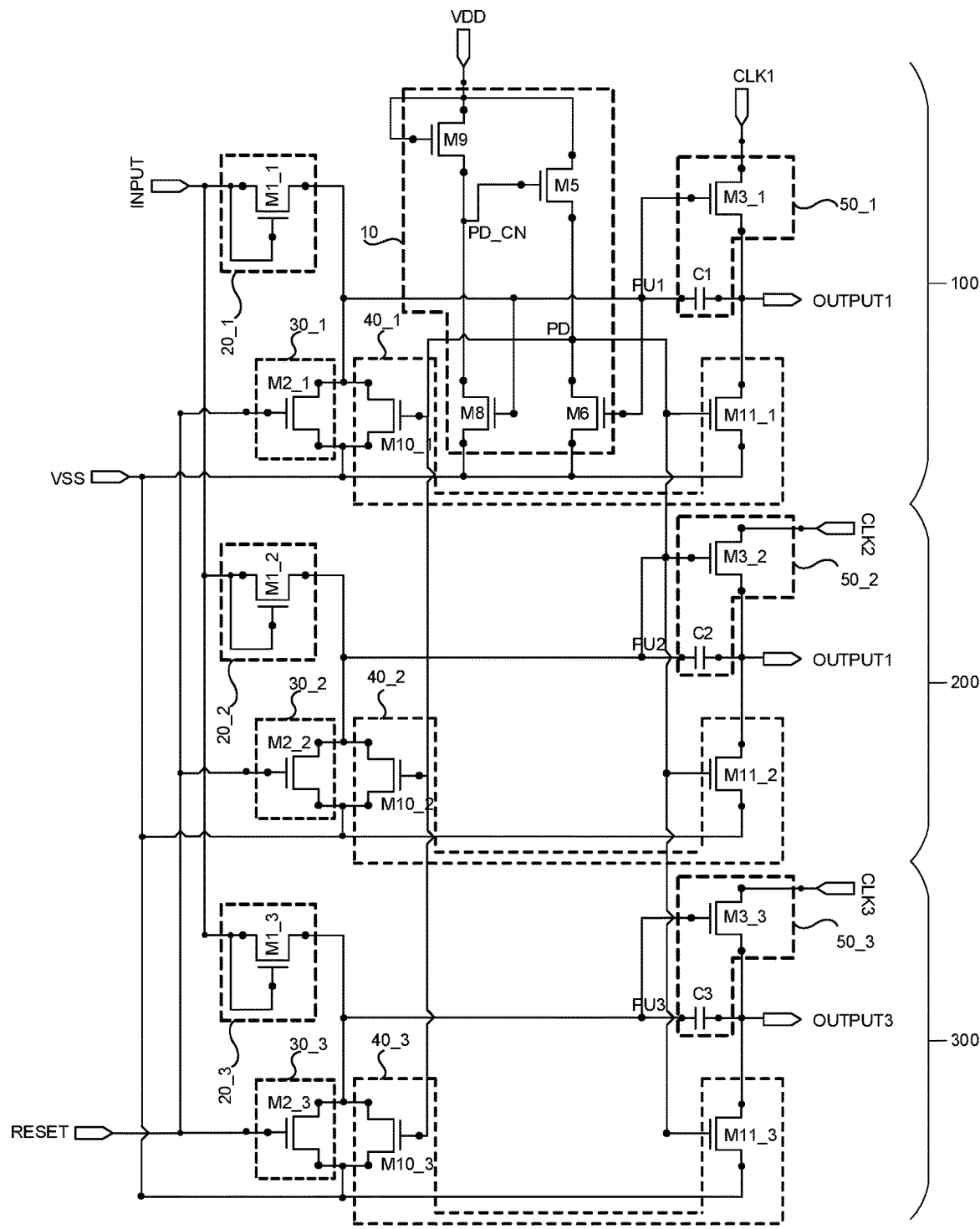
FIG. 1 is a circuit diagram of a group of shift register units in some embodiments according to the present disclosure.

FIG. 1 is a circuit diagram of a group of shift register units in some embodiments according to the present disclosure. Referring to FIG. 1, the group of shift register units includes a single input port INPUT, a single reset port RESET, and a single low-voltage port VSS, each of which being shared by the plurality of shift register units in the group of shift register units. The group of shift register units further includes a single pull-down control sub-circuit 10. Optionally, the single pull-down control sub-circuit 10 is disposed in only one of the plurality of shift register units, e.g., in the first shift register unit 100, and the rest of the plurality of shift register units do not include a pull-down control sub-circuit 10. The single pull-down control sub-circuit 10 is connected to a single high-voltage port VDD, a pull-down node PD, a pull-up node PU1, and the single low-voltage port VSS. The single pull-down control sub-circuit 10 is configured to be controlled by a potential level at the pull-up node PU1 to pull down a potential level at the pull-down node PD to a low voltage level, e.g., one provided at the single low-voltage port VSS. Optionally, the single pull-down control sub-circuit 10 is a stand-alone sub-circuit.

In some embodiments, the plurality of groups of shift register units include M numbers of groups of shift register units sequentially in an order from m=1 to m=M, wherein 1≤m≤M, M is greater than or equal to 2. A m-th group of shift register units includes N numbers of shift register units cascaded in series for respectively outputting N numbers of gate scanning signals to respective N numbers of gate lines of a display panel sequentially in an order from n=1 to n=N, wherein 1≤n≤N, N is greater than or equal to 2.

The single input port INPUT is configured to receive an input signal. Optionally, the first shift register unit of the N numbers of shift register units is a first stage of the multiple shift register units, and the input signal is a start signal. Optionally, the first shift register unit of the N numbers of shift register units is not the first stage of the multiple shift register units, and the input signal is an output signal from an output port of a shift register unit in a (m−1)-th group of shift register units. In one example, the input signal for the m-th group of shift register units is an output signal from an output port of a first shift register unit in a (m−1)-th group of shift register units.

The single reset port RESET is configured to receive an output signal from an output port of a shift register unit in a (m+1)-th group of shift register units as a reset signal. Optionally, the single reset port RESET is configured to receive an output signal from an output port of an intermediate shift register unit in the (m+1)-th group of shift register units as the reset signal. In one example, the single reset port RESET is configured to receive an output signal from an output port of a second shift register unit in the (m+1)-th group of shift register units as the reset signal. In another example, the single reset port RESET is configured to receive an output signal from an output port of a second-to-last shift register unit in the (m+1)-th group of shift register units as the reset signal.

The single pull-down control sub-circuit 10 is connected to the pull-up node PU1 in a first shift register unit of the N numbers of shift register units.

In some embodiments, 2≤N≤5, i.e., each group of the plurality of groups of shift register units includes 2 to 5 shift register units. Optionally, each group of the plurality of groups of shift register units includes a same number of shift register units. Optionally, each group of the plurality of groups of shift register units includes three shift register units, i.e., N=3.

Referring to FIG. 1, the group of shift register units in some embodiments includes a first shift register unit 100, a second shift register unit 200, and a third shift register unit 300. The single reset port RESET in a m-th group of shift register units is configured to receive an output signal from an output port of the second shift register unit in a (m+1)-th group of shift register units as a reset signal.

Figure 2:
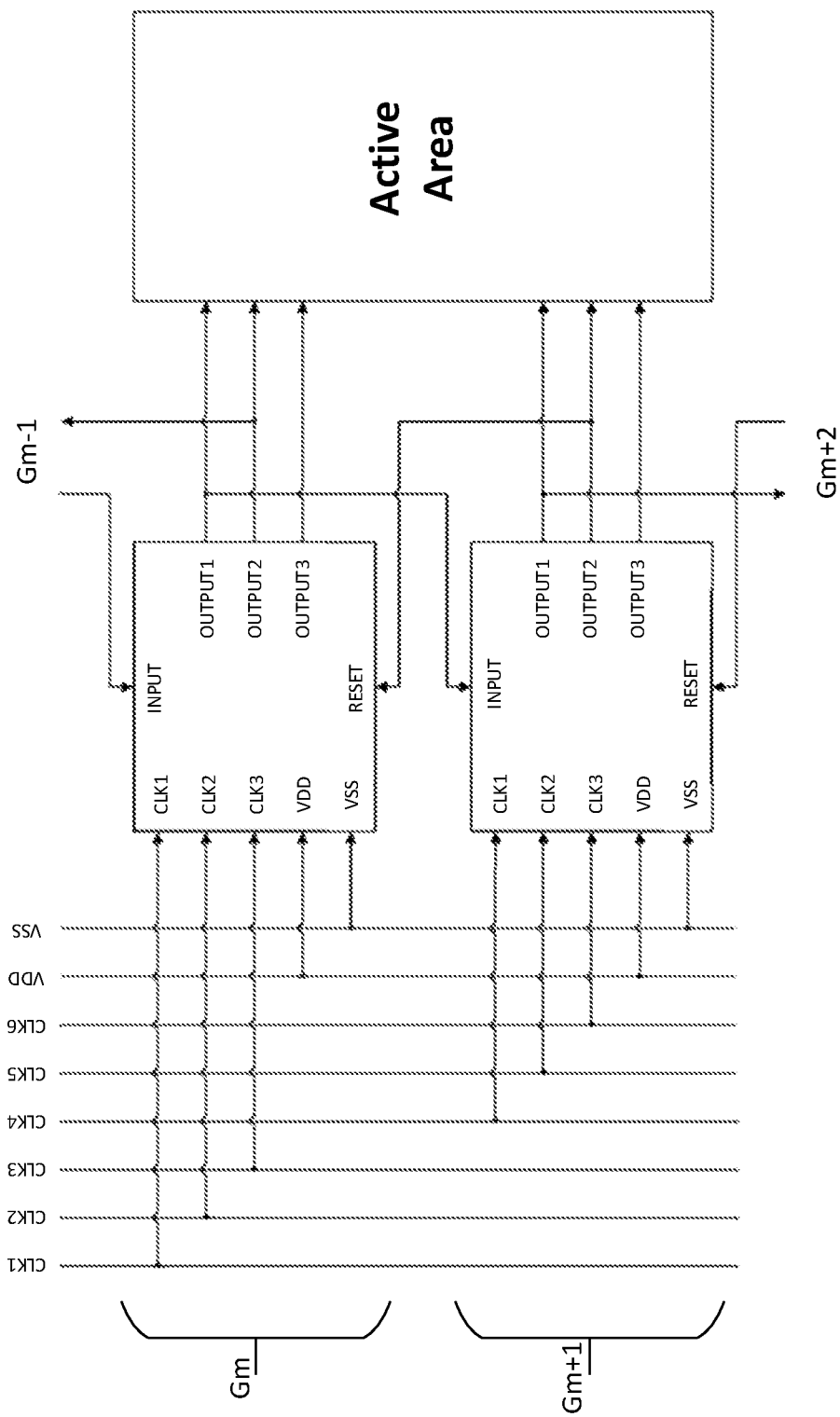
FIG. 2 is a circuit diagram of two adjacent groups of shift register units in some embodiments according to the present disclosure.

FIG. 2 is a circuit diagram of two adjacent groups of shift register units in some embodiments according to the present disclosure. In FIG. 2, each of a m-th group of shift register units Gm and a (m+1)-th group of shift register units Gm+1 includes three shift register units. The single input port INPUT of the m-th group of shift register units Gm is configured to receive an output signal from an output port of a first shift register unit in a (m−1)-th group of shift register units Gm−1 (structure not shown in FIG. 2). The single input port INPUT of a (m+1)-th group of shift register units Gm+1 is configured to receive an output signal from an output port of a first shift register unit in a m-th group of shift register units Gm, as the input signal for the single input port INPUT of a (m+1)-th group of shift register units Gm+1. An output signal from an output port OUTPUT1 of a first shift register unit in the (m+1)-th group of shift register units Gm+1 is used as an input signal for a single input port of a (m+2)-th group of shift register units Gm+2 (structure not shown in FIG. 2). The single reset port RESET in the m-th group of shift register units Gm is configured to receive an output signal from an output port OUTPUT2 of a second shift register unit in a (m+1)-th group of shift register units Gm+1 as a reset signal. The single reset port RESET in the (m+1)-th group of shift register units Gm+1 is configured to receive an output signal from an output port of a second shift register unit in a (m+2)-th group of shift register units Gm+2 (structure not shown in FIG. 2) as a reset signal. An output signal from an output port OUTPUT2 of the m-th group of shift register units Gm is used as a reset signal for a single reset port RESET in the (m−1)-th group of shift register units Gm−1 (structure not shown in FIG. 2).

In some embodiments, each of the N numbers of shift register units includes a pull-up control sub-circuit. The pull-up control sub-circuit in a n-th shift register unit of the N numbers of shift register units includes a first transistor having a gate and a first terminal commonly connected to the single input port, and a second terminal connected to the pull-up node in the n-th shift register unit. Referring to FIG. 1, each of the first shift register unit 100, the second shift register unit 200, and the third shift register unit 300 includes a pull-up control sub-circuit. For example, the pull-up control sub-circuit 20_1 in the first shift register unit 100 includes a first transistor M1_1 having a gate and a first terminal commonly connected to the single input port INPUT, and a second terminal connected to the pull-up node PU1 in the first shift register unit 100. The pull-up control sub-circuit 20_2 in the second register unit 200 or the pull-up control sub-circuit 20_3 in the third register unit 300 has a similar structure.

In some embodiments, each of the N numbers of shift register units includes a reset sub-circuit. The reset sub-circuit in an n-th shift register unit of the N numbers of shift register units is connected to the single reset port, the single low-voltage port, and the pull-up node in the n-th shift register unit, and configured to pull down potential levels at the pull-up node in the n-th shift register unit to a low voltage level. The reset sub-circuit in the n-th shift register unit includes a second transistor having a gate connected to the single reset port, a first terminal connected to the pull-up node in the n-th shift register unit, and a second terminal connected to the single low-voltage port. Referring to FIG. 1, the reset sub-circuit 30_1 in the first shift register unit 100 includes a second transistor M2_1 having a gate connected to the single reset port RESET, a first terminal connected to the pull-up node PU1 in the first shift register unit 100, and a second terminal connected to the single low-voltage port VSS. The reset sub-circuit 30_1 is connected to the single reset port RESET, the single low-voltage port VSS, and the pull-up node PU1 in the first shift register unit 100, and is configured to pull down potential levels at the pull-up node PU1 in the first shift register unit 100 to a low voltage level. The reset sub-circuit 30_2 in the second register unit 200 or the reset sub-circuit 30_3 in the third register unit 300 has a similar structure.

In some embodiments, the single pull-down control sub-circuit includes a ninth transistor having a gate and a first terminal commonly connected to the single high-voltage port, and a second terminal connected to a pull-down connection node; a fifth transistor having a gate connected to the pull-down connection node, a first terminal connected to the single high-voltage port, and a second terminal connected to the pull-down node in the first shift register unit of the N numbers of shift register units; an eighth transistor having a gate connected to the pull-up node in the first shift register unit of the N numbers of shift register units, a first terminal connected to the pull-down connection node, and a second terminal connected to the single low-voltage port; and a sixth transistor having a gate connected to the pull-up node in the first shift register unit of the N numbers of shift register units, a first terminal connected to the pull-down node in the first shift register unit of the N numbers of shift register units, and a second terminal connected to the single low-voltage port. Referring to FIG. 1, the single pull-down control sub-circuit 10 includes a ninth transistor M9 having a gate and a first terminal commonly connected to the single high-voltage port VDD, and a second terminal connected to a pull-down connection node PD_CN; a fifth transistor M5 having a gate connected to the pull-down connection node PD_CN, a first terminal connected to the single high-voltage port VDD, and a second terminal connected to the pull-down node PD in the first shift register unit 100; an eighth transistor M8 having a gate connected to the pull-up node PU1 in the first shift register unit 100, a first terminal connected to the pull-down connection node PD_CN, and a second terminal connected to the single low-voltage port VSS; and a sixth transistor M6 having a gate connected to the pull-up node PU1 in the first shift register unit 100, a first terminal connected to the pull-down node PD in the first shift register unit 100, and a second terminal connected to the single low-voltage port VSS.

In some embodiments, each of the N numbers of shift register units includes a noise reduction sub-circuit. The noise reduction sub-circuit in a n-th shift register unit of the N numbers of shift register units includes a tenth transistor having a gate connected to the pull-down node in the first shift register unit of the N numbers of shift register units, a first terminal connected to the pull-up node in the n-th shift register unit, and a second terminal connected to the single low-voltage port; and an eleventh transistor having a gate connected to the pull-down node in the first shift register unit of the N numbers of shift register units, a first terminal connected to an output port in the n-th shift register unit, and a second terminal connected to the single low-voltage port. Referring to FIG. 1, the noise reduction sub-circuit 40_1 in the first shift register unit 100 includes a tenth transistor M10_1 having a gate connected to the pull-down node PD in the first shift register unit 100, a first terminal connected to the pull-up node PU1 in the first shift register unit 100, and a second terminal connected to the single low-voltage port VSS; and an eleventh transistor M11_1 having a gate connected to the pull-down node PD in the first shift register unit 100, a first terminal connected to an output port in the first shift register unit 100, and a second terminal connected to the single low-voltage port VSS. The noise reduction sub-circuit 40_2 in the second shift register unit 200 includes a tenth transistor M10_2 having a gate connected to the pull-down node PD in the first shift register unit 100, a first terminal connected to the pull-up node PU2 in the second shift register unit 200, and a second terminal connected to the single low-voltage port VSS; and an eleventh transistor M11_2 having a gate connected to the pull-down node PD in the first shift register unit 100, a first terminal connected to an output port in the second shift register unit 200, and a second terminal connected to the single low-voltage port VSS. The noise reduction sub-circuit 40_3 in the third shift register unit 300 includes a tenth transistor M10_3 having a gate connected to the pull-down node PD in the first shift register unit 100, a first terminal connected to the pull-up node PU3 in the third shift register unit 300, and a second terminal connected to the single low-voltage port VSS; and an eleventh transistor M11_3 having a gate connected to the pull-down node PD in the first shift register unit 100, a first terminal connected to an output port in the third shift register unit 300, and a second terminal connected to the single low-voltage port VSS.

In some embodiments, each of the N numbers of shift register units includes a pull-up sub-circuit. The pull-up sub-circuit in a n-th shift register unit of the N numbers of shift register units includes a third transistor and a capacitor, the third transistor having a gate connected to the pull-up node in the n-th shift register unit, a first terminal connected to a clock input port in the n-th shift register unit, and a second terminal connected to an output port in the n-th shift register unit, the capacitor having first terminal connected to the pull-up node in the n-th shift register unit and a second terminal connected to the output port in the n-th shift register unit. The pull-up sub-circuit is configured to be controlled by the potential level at the pull-up node in the n-th shift register unit to output a clock signal from the clock input port in the n-th shift register unit to the output port in the n-th shift register unit. Referring to FIG. 1, The pull-up sub-circuit 50_1 in the first shift register unit 100 includes a third transistor M3_1 and a capacitor C1, the third transistor M3_1 having a gate connected to the pull-up node PU1 in the first shift register unit 100, a first terminal connected to a clock input port CLK1 in the first shift register unit 100, and a second terminal connected to an output port OUTPUT in the first shift register unit 100, the first capacitor C1 having first terminal connected to the pull-up node PU1 in the first shift register unit 100 and a second terminal connected to the output port OUTPUT1 in the first shift register unit 100. The pull-up sub-circuit 50_1 is configured to be controlled by the potential level at the pull-up node PU1 in the first shift register unit 100 to output a clock signal from the clock input port CLK1 in the first shift register unit 100 to the output port OUTPUT1 in the first shift register unit 100. The pull-up sub-circuit 50_2 in the second register unit 200 or the pull-up sub-circuit 50_3 in the third register unit 300 has a similar structure.

Figure 3:
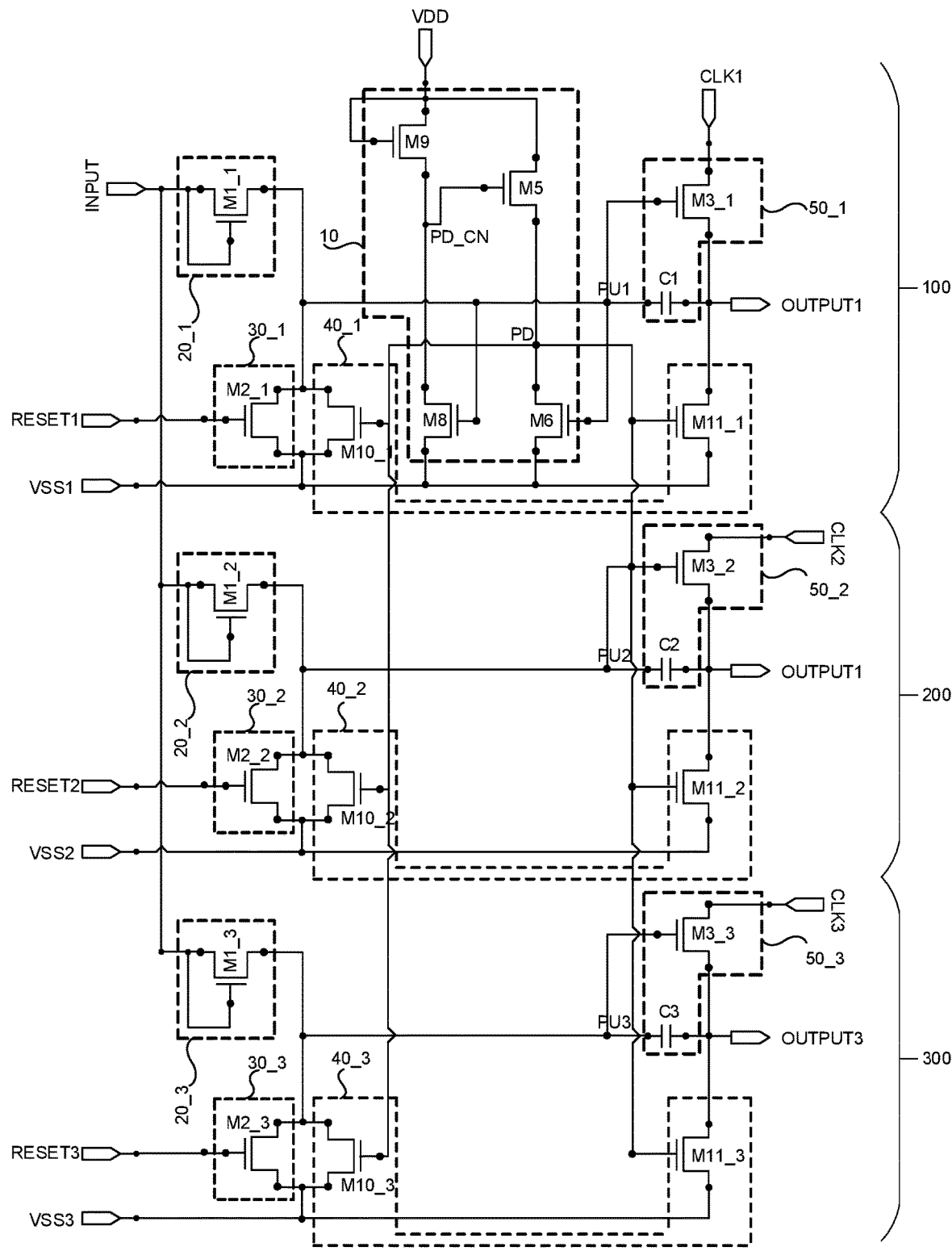
FIG. 3 is a circuit diagram of a group of shift register units in some embodiments according to the present disclosure.

The plurality of shift register units in each group of shift register units in FIG. 1 are shown to share a single input port INPUT, a single reset port RESET, and a single low voltage port VSS. Optionally, each of the plurality of shift register units in each group of shift register units includes an input port. Optionally, each of the plurality of shift register units in each group of shift register units includes a reset port. Optionally, each of the plurality of shift register units in each group of shift register units includes a low voltage port. FIG. 3 is a circuit diagram of a group of shift register units in some embodiments according to the present disclosure. Referring to FIG. 3, the first shift register unit 100 includes a first reset port RESET1 and a first low voltage port VSS1; the second shift register unit 200 includes a second reset port RESET2 and a second low voltage port VSS2; and the third shift register unit 300 includes a third reset port RESET3 and a third low voltage port VSS3. Although the first shift register unit 100, the second shift register unit 200, and the third shift register unit 300 in FIG. 3 are shown to share a single input port INPUT, optionally, each shift register unit in a group of shift register units may have a separate input port.

Figure 4:
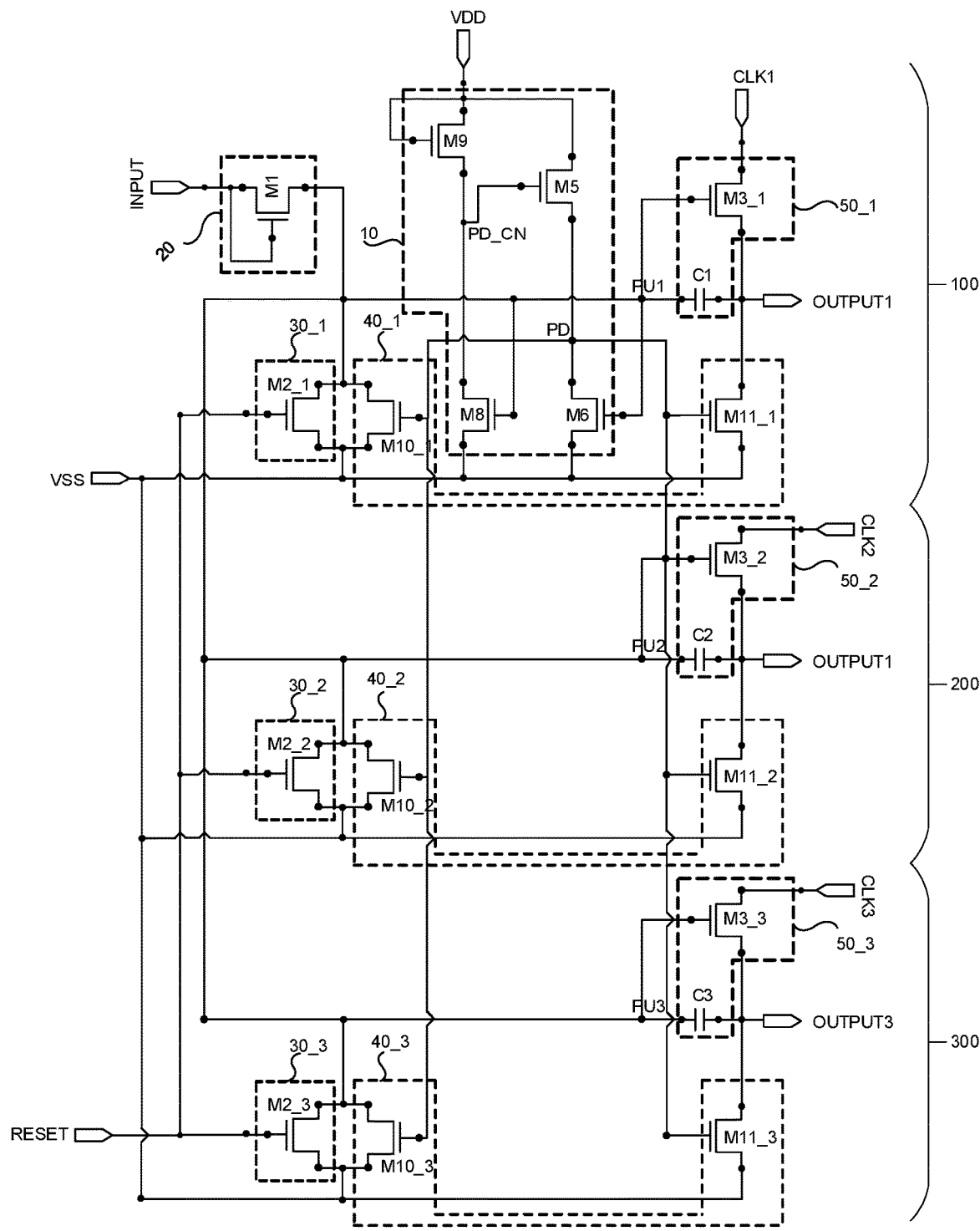
FIG. 4 is a circuit diagram of a group of shift register units in some embodiments according to the present disclosure.

In some embodiments, each of the plurality of groups of shift register units includes a single pull-up control sub-circuit. FIG. 4 is a circuit diagram of a group of shift register units in some embodiments according to the present disclosure. Referring to FIG. 4, the single pull-up control sub-circuit 20 is in a first shift register unit 100 of the group of shift register units. The single pull-up control sub-circuit 20 includes a first transistor M1 having a gate and a first terminal commonly connected to a single input port INPUT configured to receive an input signal, and a second terminal connected to the pull-up nodes PU1, PU2, and PU3 respectively in the first shift register unit 100, the second shift register unit 200, and the third shift register unit 300. The single pull-up control sub-circuit 20 is configured to output a high voltage to the pull-up nodes PU1, PU2, and PU3 and control the single pull-down control sub-circuit 10 to pull down potential levels at the pull-down node PD and the pull-down connection node PD_CN.

In another aspect, the present disclosure provides a display panel having a gate driving circuit described herein.

In another aspect, the present disclosure provides a display apparatus having a gate driving circuit described herein. Examples of appropriate display apparatuses include, but are not limited to, an electronic paper, a mobile phone, a tablet computer, a television, a monitor, a notebook computer, a digital album, a GPS, etc.

Figure 5A:
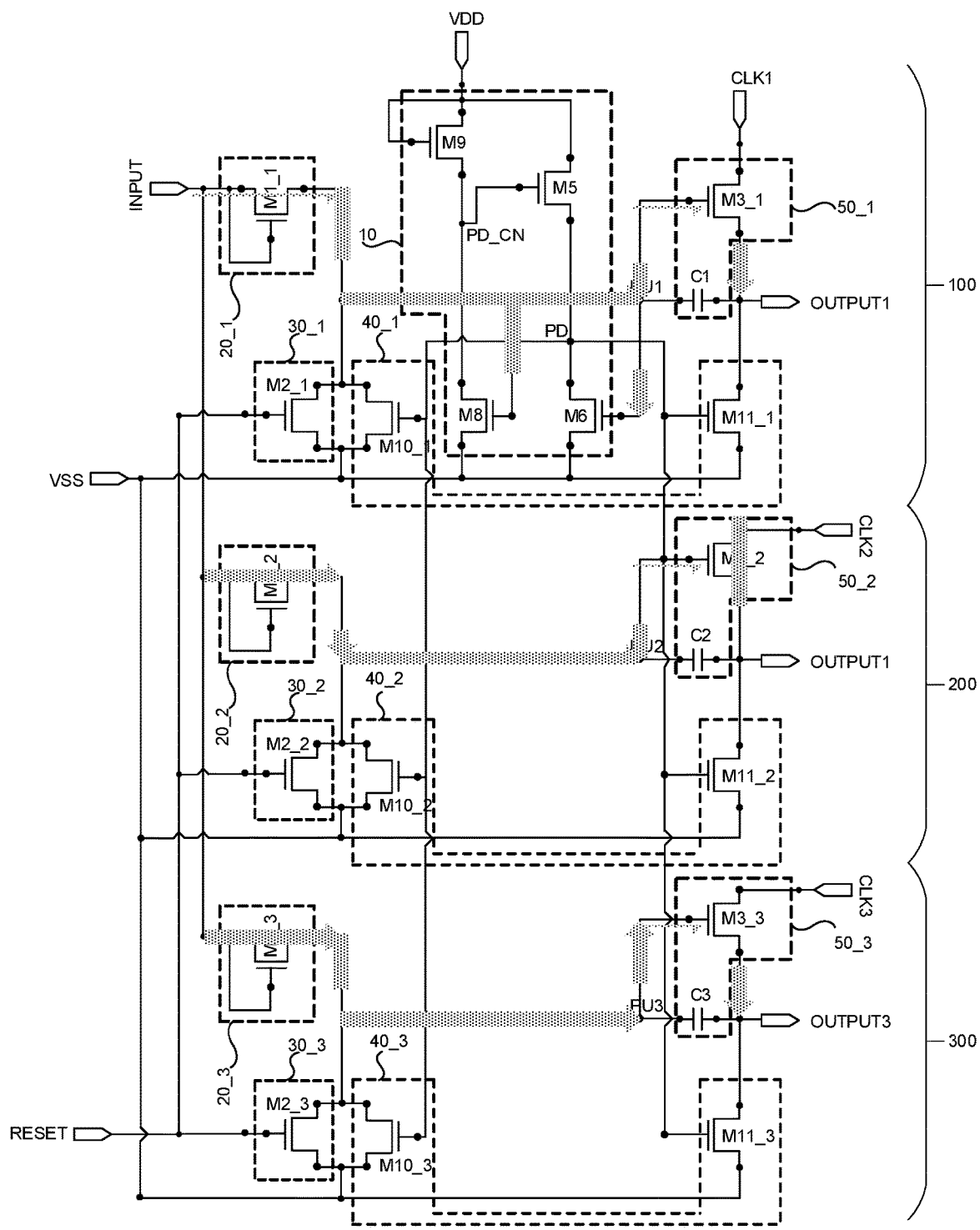
FIG. 5A illustrates the group of shift register units of FIG. 1 operated in a charging period of a display cycle in some embodiments according to the present disclosure.
Figure 5B:
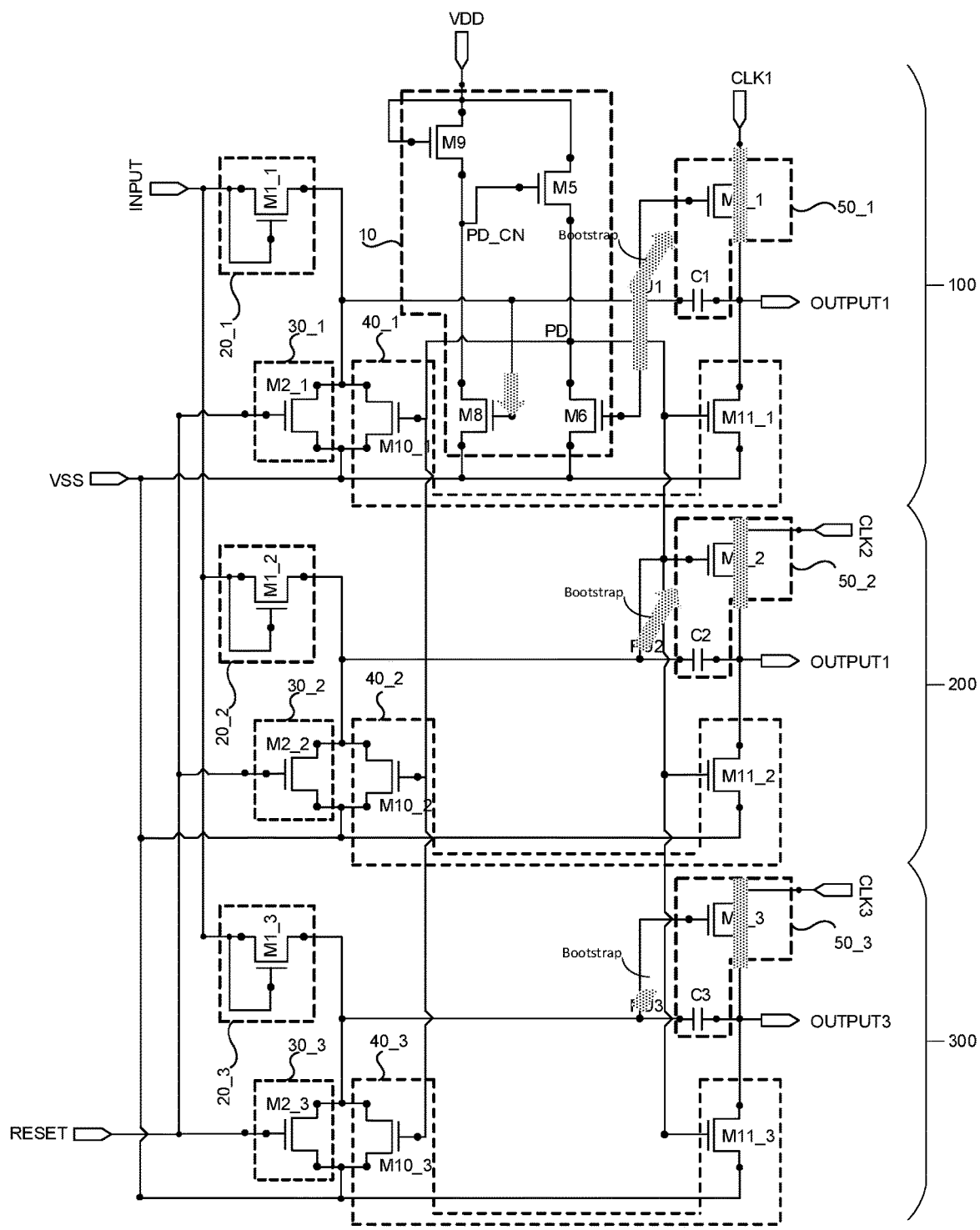
FIG. 5B illustrates the group of shift register units of FIG. 1 operated in an output period of a display cycle in some embodiments according to the present disclosure.
Figure 5C:
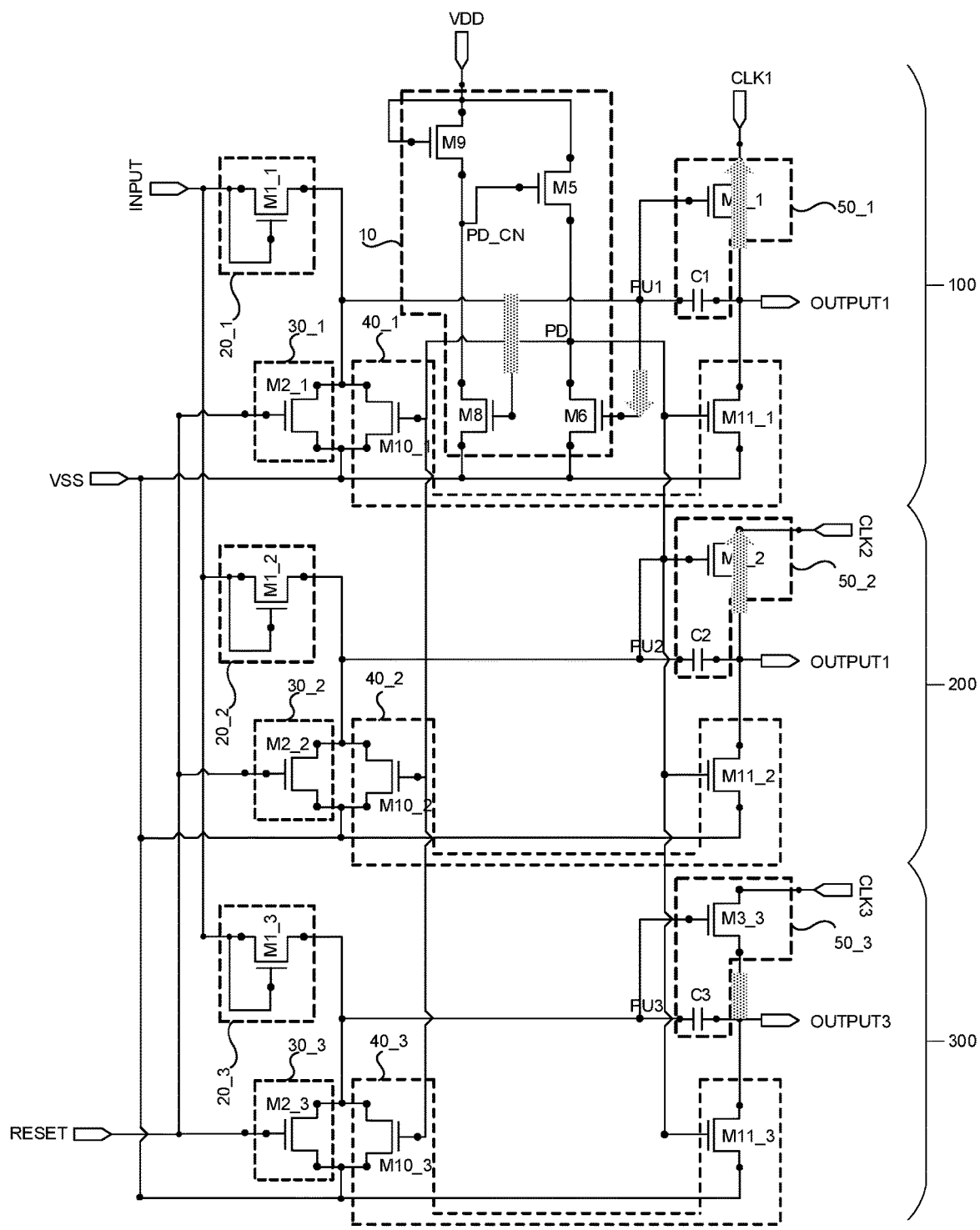
FIG. 5C illustrates the group of shift register units of FIG. 1 operated in a discharging period of a display cycle in some embodiments according to the present disclosure.
Figure 5D:
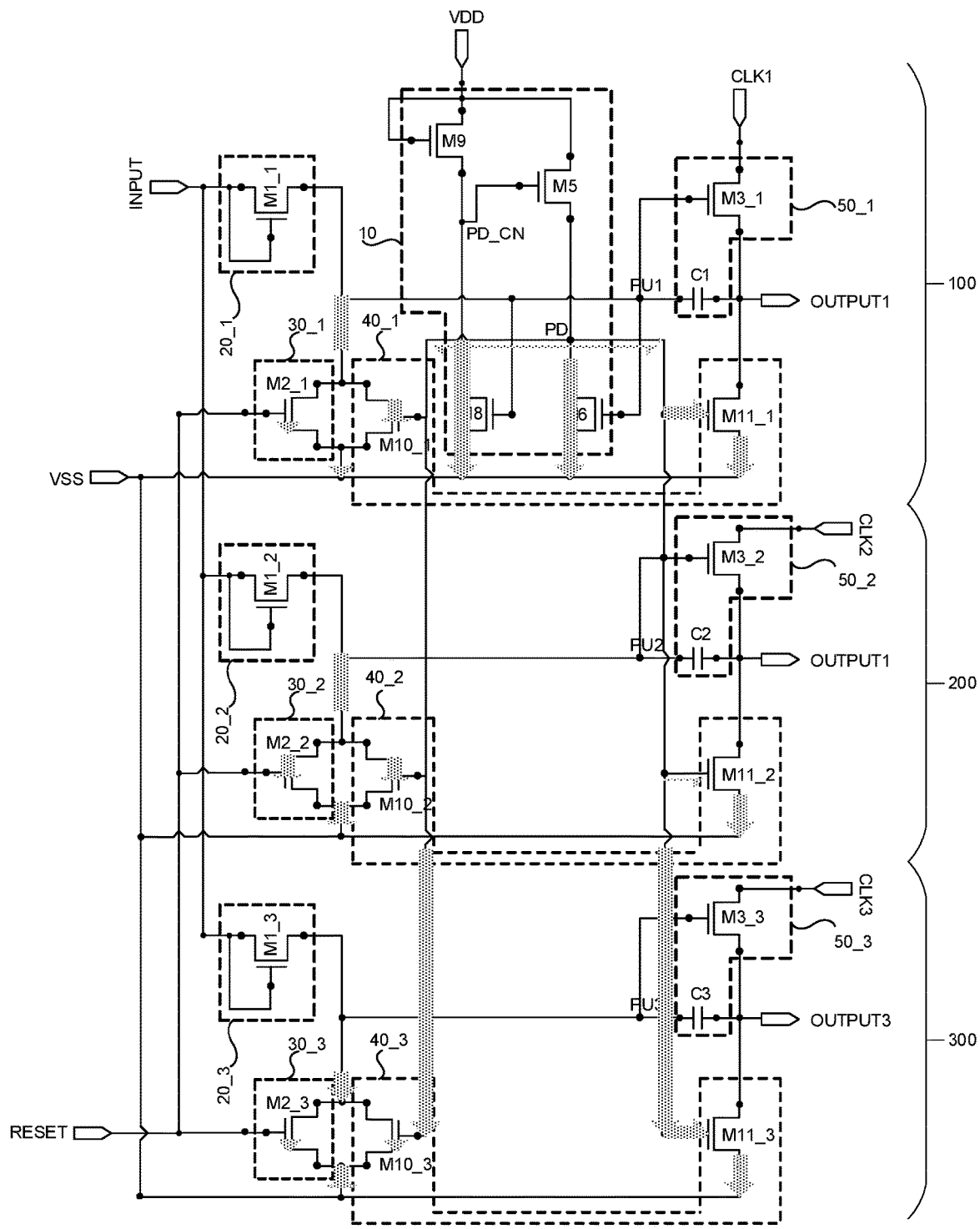
FIG. 5D illustrates the group of shift register units of FIG. 1 operated in a reset period of a display cycle in some embodiments according to the present disclosure.

In another aspect, the present disclosure provides a method of driving a gate driving circuit for respectively generating multiple gate driving signals at respective output ports of multiple shift register units in a plurality of image display cycles. In one display cycle, a frame of image is displayed. In some embodiments, each display cycle includes sequentially a charging period, an output period, a discharging period, a reset period, and a maintaining period. In some embodiments, the gate driving circuit includes multiple shift register units cascaded one after another in multiple stages, wherein the multiple shift register units are grouped into a plurality of groups of shift register units, each of the plurality of groups of shift register units including a plurality of shift register units. Optionally, each of the plurality of groups of shift register units includes a single pull-down control sub-circuit. Optionally, the single pull-down control sub-circuit is disposed in only one of the plurality of shift register units, e.g., in the first shift register unit of the plurality of shift register units; and the rest of the plurality of shift register units do not include a pull-down control sub-circuit. Optionally, the single pull-down control sub-circuit is a stand-alone sub-circuit. Optionally, each of the plurality of groups of shift register units includes a single input port, a single reset port, and a single low-voltage port, each of which being shared by the plurality of shift register units. Optionally, the single pull-down control sub-circuit is connected to a single high-voltage port, a pull-down node, a pull-up node, and a first low-voltage port (e.g., a single low-voltage port). In some embodiments, the method includes providing an input signal to the plurality of groups of shift register units through one or more input ports (e.g., a single input port) in the charging period, and providing a reset signal to the plurality of groups of shift register units through one or more reset ports (e.g., a single reset port) in the reset period. FIG. 5A illustrates the group of shift register units of FIG. 1 operated in a charging period of a display cycle in some embodiments according to the present disclosure. Referring to FIG. 5A, in the charging period, an input signal is provided to the first shift register unit 100, the second shift register unit 200, and the third shift register unit 300, through the single input port INPUT, e.g., to turn on the first transistor M1_1 in the first shift register unit 100, the first transistor M1_2 in the second shift register unit 200, and the first transistor M1_3 in the third shift register unit 300. FIG. 5D illustrates the group of shift register units of FIG. 1 operated in a reset period of a display cycle in some embodiments according to the present disclosure. Referring to FIG. 5D, in the reset period, a reset signal (e.g., an output signal from an output port of the second shift register unit in a next group of shift register units) is provided to the first shift register unit 100, the second shift register unit 200, and the third shift register unit 300, through the single reset port RESET, e.g., to turn on the second transistor M2_1 in the first shift register unit 100, the second transistor M2_2 in the second shift register unit 200, and the second transistor M2_3 in the third shift register unit 300.

In some embodiments, the single pull-down control sub-circuit is connected to a single high-voltage port, a pull-down node, a pull-up node, and the first low-voltage port (e.g., the single low-voltage port). Optionally, the method further includes controlling the pull-up node to be at a high potential level; and controlling the single pull-down control sub-circuit by the potential level at the pull-up node, to pull down a potential level at the pull-down node to a low voltage level, e.g., one provided at the single low-voltage port. Referring to FIG. 5A, in the charging period, the input signal is provided to the first shift register unit 100, the second shift register unit 200, and the third shift register unit 300, through the single input port INPUT to control the pull-up control sub-circuits 20_1, 20_2, and 20_3 respectively in the first shift register unit 100, the second shift register unit 200, and the third shift register unit 300 to output a high voltage respectively to the pull-up nodes PU1, PU2, and PU3, and to control the single pull-down control sub-circuit 10 to pull down potential levels at the pull-down node PD and the pull-down connection node PD_CN to a low voltage level. FIG. B illustrates the group of shift register units of FIG. 1 operated in an output period of a display cycle in some embodiments according to the present disclosure. FIG. 5C illustrates the group of shift register units of FIG. 1 operated in a discharging period of a display cycle in some embodiments according to the present disclosure. In the output period and the discharging period, the potential level at the pull-up node PU is maintained at a high level, and the potential levels at the pull-down node PD and the pull-down connection node PD_CN are maintained at low voltage levels.

In some embodiments, the plurality of groups of shift register units include M numbers of groups of shift register units sequentially in an order from m=1 to m=M, wherein 1≤m≤M, M is greater than or equal to 2; a m-th group of shift register units includes N numbers of shift register units cascaded in series for respectively outputting N numbers of gate scanning signals to respective N numbers of gate lines of a display panel sequentially in an order from n=1 to n=N, wherein 1≤n≤N, N is greater than or equal to 2; and the single pull-down control sub-circuit is connected to the pull-up node in a first shift register unit of the N numbers of shift register units. Optionally, the step of providing the reset signal to the plurality of groups of shift register units through one or more reset ports (e.g., a single reset port) in the reset period includes providing an output signal from an output port of a shift register unit in a (m+1)-th group of shift register units as the reset signal to the plurality of groups of shift register units through the one or more reset ports (e.g., the single reset port) in the reset period. Referring to FIG. 2, the single reset port RESET in the m-th group of shift register units Gm is configured to receive an output signal from an output port OUTPUT2 of a second shift register unit in a (m+1)-th group of shift register units Gm+1 as a reset signal.

In some embodiments, the step of providing the input signal to the plurality of groups of shift register units through the one or more input ports (e.g., a single input port) in the charging period includes providing an output signal from an output port of a shift register unit in a (m−1)-th group of shift register units as the input signal to plurality of groups of shift register units through the one or more input ports (e.g., the single input port) in the charging period. Referring to FIG. 2, the single input port INPUT of the m-th group of shift register units Gm is configured to receive an output signal from an output port of a first shift register unit in a (m−1)-th group of shift register units Gm−1 (structure not shown in FIG. 2).

In some embodiments, the first shift register unit of the N numbers of shift register units is a first stage of the multiple shift register units; and the step of providing the input signal to the plurality of groups of shift register units through the one or more input ports (e.g., the single input port) in the charging period includes providing a start signal as the input signal to plurality of groups of shift register units through the one or more input ports (e.g., the single input port) in the charging period.

In some embodiments, each of the N numbers of shift register units includes a pull-up control sub-circuit, a reset sub-circuit, a noise reduction sub-circuit, and a pull-up sub-circuit. The pull-up control sub-circuit in a n-th shift register unit of the N numbers of shift register units includes a first transistor having a gate and a first terminal commonly connected to an input port (e.g., the single input port) configured to receive the input signal, and a second terminal connected to the pull-up node in the n-th shift register unit. The reset sub-circuit in a n-th shift register unit of the N numbers of shift register units includes a second transistor having a gate connected to a reset port (e.g., the single reset port) configured to receive the reset signal, a first terminal connected to the pull-up node in the n-th shift register unit, and a second terminal connected to a low-voltage port (e.g., the single low-voltage port). The single pull-down control sub-circuit includes a ninth transistor having a gate and a first terminal commonly connected to the single high-voltage port, and a second terminal connected to a pull-down connection node, a fifth transistor having a gate connected to the pull-down connection node, a first terminal connected to the single high-voltage port, and a second terminal connected to the pull-down node in the first shift register unit of the N numbers of shift register units, an eighth transistor having a gate connected to the pull-up node in the first shift register unit of the N numbers of shift register units, a first terminal connected to the pull-down connection node, and a second terminal connected to the first low-voltage port (e.g., the single low-voltage port), and a sixth transistor having a gate connected to the pull-up node in the first shift register unit of the N numbers of shift register units, a first terminal connected to the pull-down node in the first shift register unit of the N numbers of shift register units, and a second terminal connected to the first low-voltage port (e.g., the single low-voltage port). The noise reduction sub-circuit in a n-th shift register unit of the N numbers of shift register units includes a tenth transistor having a gate connected to the pull-down node in the first shift register unit of the N numbers of shift register units, a first terminal connected to the pull-up node in the n-th shift register unit, and a second terminal connected to the low-voltage port (e.g., the single low-voltage port), and an eleventh transistor having a gate connected to the pull-down node in the first shift register unit of the N numbers of shift register units, a first terminal connected to an output port in the n-th shift register unit, and a second terminal connected to the low-voltage port (e.g., the single low-voltage port). The pull-up sub-circuit in a n-th shift register unit of the N numbers of shift register units includes a third transistor and a capacitor, the third transistor having a gate connected to the pull-up node in the n-th shift register unit, a first terminal connected to a clock input port in the n-th shift register unit, and a second terminal connected to an output port in the n-th shift register unit, the capacitor having first terminal connected to the pull-up node in the n-th shift register unit and a second terminal connected to the output port in the n-th shift register unit.

In some embodiments, each of the plurality of groups of shift register units includes a single input port and a single pull-up control sub-circuit. Optionally, the single pull-up control sub-circuit includes a first transistor having a gate and a first terminal commonly connected the single input port configured to receive the input signal, and a second terminal connected to pull-up nodes in the N numbers of shift register units.

Figure 6:
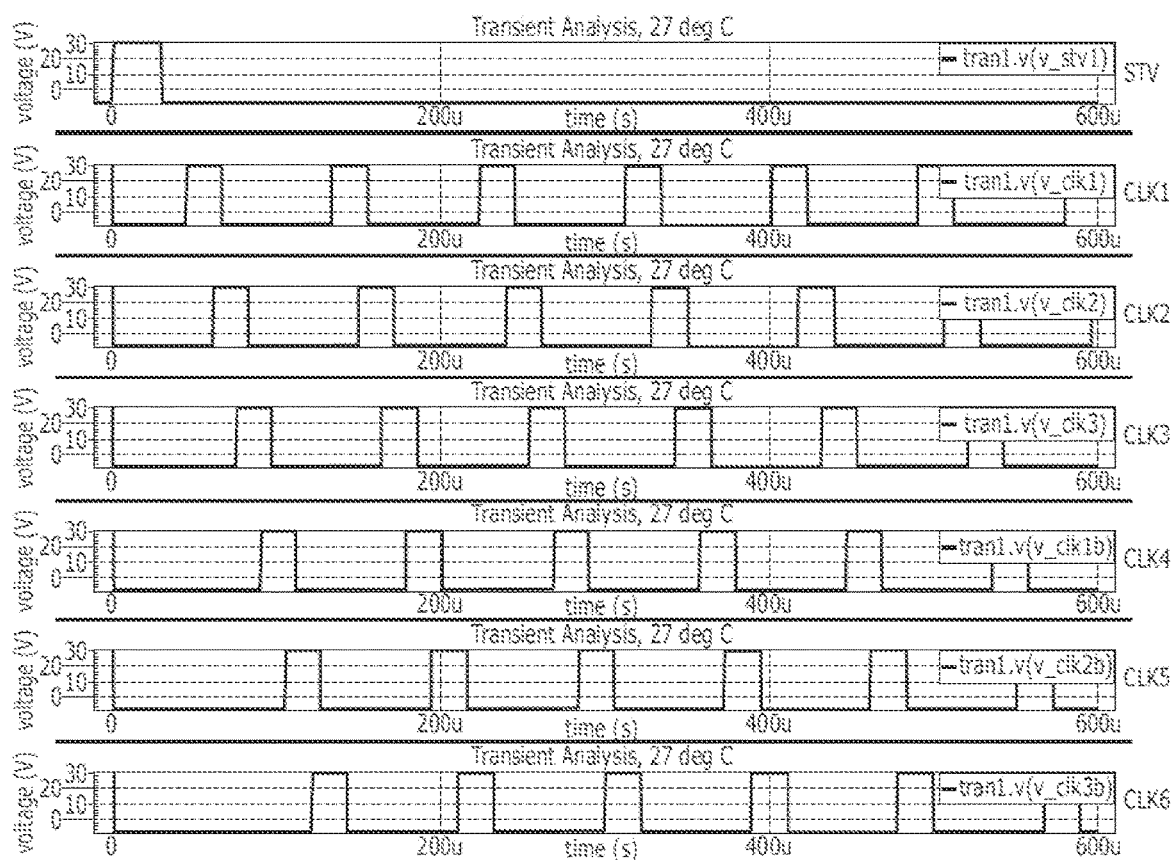
FIG. 6 is a timing diagram of input clock signals for operating the two adjacent groups of shift register units of FIG. 2.
Figure 7:
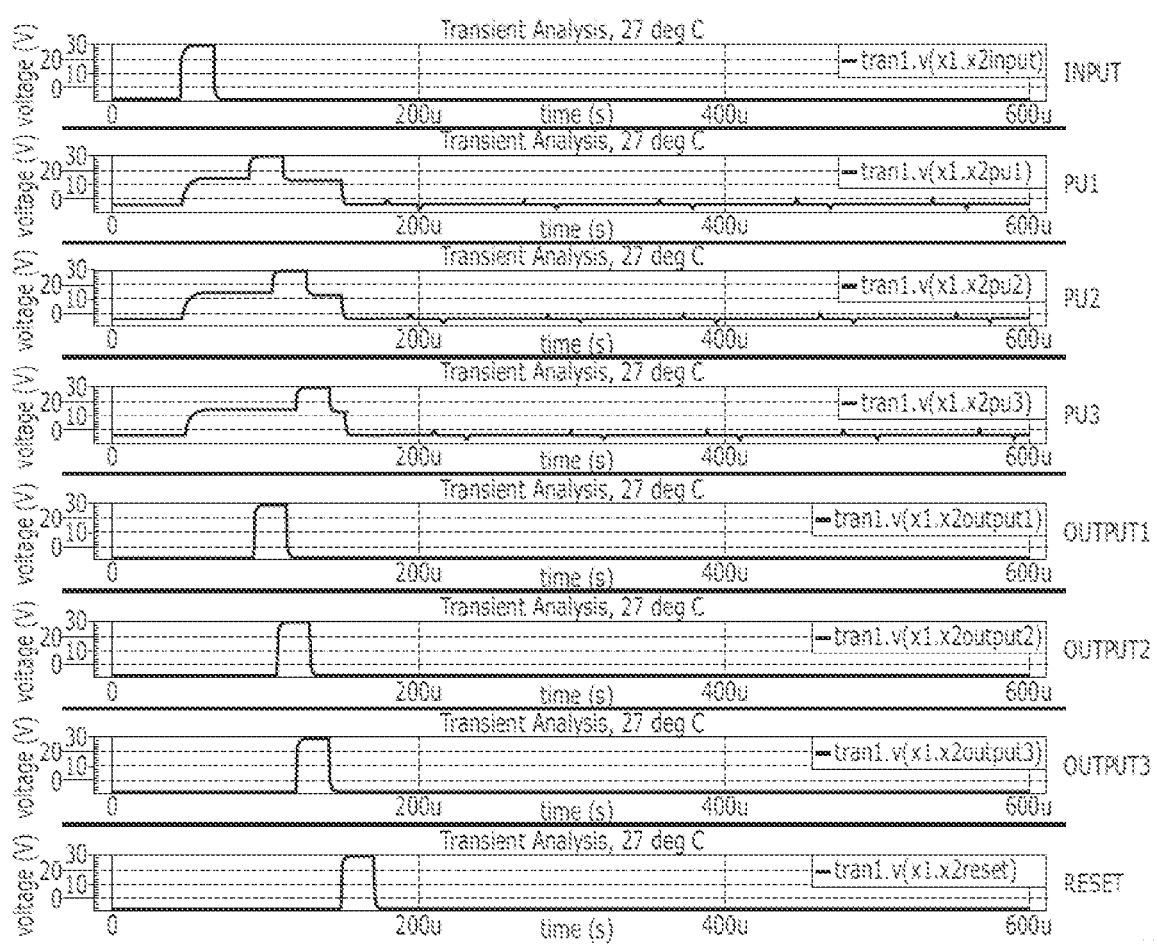
FIG. 7 is a timing diagram of various signals for operating the two adjacent groups of shift register units of FIG. 2.

In some embodiments, in the charging period, the method further includes providing the input signal to the n-th shift register unit through an input port (e.g., the single input port) to control the pull-up control sub-circuit in the n-th shift register unit to output a high voltage to the pull-up node in the n-th shift register unit, and controlling the single pull-down control sub-circuit to pull down potential levels at the pull-down node and the pull-down connection node. Referring to FIG. 5A, in the charging period, an input signal is provided to the first shift register unit 100, the second shift register unit 200, and the third shift register unit 300, through the single input port INPUT, e.g., to turn on the first transistor M1_1 in the pull-up control sub-circuit 20_1 in the first shift register unit 100, the first transistor M_2 in the pull-up control sub-circuit 20_2 in the second shift register unit 200, and the first transistor M1_3 in the pull-up control sub-circuit 20_3 in the third shift register unit 300. The high voltage input signal is outputted to the pull-up nodes PU1, PU2, and PU3, respectively, in the first shift register unit 100, the second shift register unit 200, and the third shift register unit 300. Under the control of the high voltage level at the pull-up node PU1, the sixth transistor M6 and the eighth transistor M8 in the single pull-down control sub-circuit 10 in the first shift register unit 100 are turned on, potential levels at the pull-down node PD and the pull-down connection node PD_CN are pulled down to low voltage levels, e.g., by the low voltage level provided at the single low voltage port VSS. In one example, the potential level at the pull-down node PD is pulled down to ~0 V, and the potential level at the pull-down connection node PD_CN is pulled down to ~−6 V. FIG. 6 is a timing diagram of input clock signals for operating the two adjacent groups of shift register units of FIG. 2. FIG. 7 is a timing diagram of various signals for operating the two adjacent groups of shift register units of FIG. 2. Referring to FIG. 6 and FIG. 7, in the charging period, the clock signals CLK1, CLK2, and CLK3 are at low voltage levels.

In some embodiments, in the output period, the method further includes controlling the pull-up sub-circuit in the n-th shift register unit by a high potential level at the pull-up node in the n-th shift register unit to output a high voltage clock signal from the clock input port in the n-th shift register unit to the output port in the n-th shift register unit, and outputting an output signal from the output port in a first shift register unit in the m-th group of shift register units to an input port in a first shift register unit in the (m+1)-th group of shift register units to start the charging period in the (m+1)-th group of shift register units. Referring to FIG. 5B, in the output period, the potential levels at the pull-up nodes PU1, PU2, and PU3 remain at a high voltage level. Due to bootstrapping effect of the capacitors C1, C2, and C3, respectively, the potential levels of the pull-up nodes PU1, PU2, and PU3 in the output period are pushed to higher levels than those in the charging period. Under the control of the high voltage levels at the pull-up node PU1, the pull-up node PU2, and the pull-up node PU3, respectively, the third transistor M3_1 in the pull-up sub-circuit 50_1 in the first shift register unit 100, the third transistor M3_2 in the pull-up sub-circuit 50_2 in the second shift register unit 200, and the third transistor M3_3 in the pull-up sub-circuit 50_3 in the third shift register unit 300, are turned on. When the clock signals CLK1, CLK2, and CLK3 reverse to a high voltage level, the high voltage clock signals pass through the third transistor M3_1, the third transistor M3_2, and the third transistor M3_3, respectively. The high voltage clock signals are outputted respectively to the output ports OUTPUT1, OUTPUT2, and OUTPUT3, which are further outputted to gate lines as gate drive signals.

In some embodiments, pull-up nodes PU in the N numbers of shift register units in the m-th group of shift register units are sequentially and non-simultaneously bootstrapped one by one, and high voltage clock signals are outputted from output ports OUTPUT in the N numbers of shift register units in the m-th group of shift register units sequentially and non-simultaneously. Referring to FIG. 7, the potential levels of the pull-up nodes PU1, PU2, and PU3 in the output period are bootstrapped to higher levels than those in the charging period sequentially and non-simultaneously, one-by-one. Correspondingly, the high voltage clock signals are outputted respectively to the output ports OUTPUT1, OUTPUT2, and OUTPUT3, sequentially and non-simultaneously. As shown in FIG. 7, in some embodiments, the potential levels of the pull-up nodes PU1, PU2, and PU3, after being bootstrapped, are pulled down to low voltage levels substantially at the same time.

In the output period, under the control of the bootstrapped, high voltage level at the pull-up node PU1, the sixth transistor M6 and the eighth transistor MS in the single pull-down control sub-circuit 10 in the first shift register unit 100 are turned on, potential levels at the pull-down node PD and the pull-down connection node PD_CN are pulled down to low voltage levels, e.g., by the low voltage level provided at the single low voltage port VSS. In one example, the potential level at the pull-down node PD is pulled down to ~−4 V.

Referring to FIG. 2, an output signal from an output port of a first shift register unit in a m-th group of shift register units Gm is outputted in the output period to the single input port INPUT of a (m+1)-th group of shift register units Gm+1, and used as the input signal for the single input port INPUT of a (m+1)-th group of shift register units Gm+1.

In some embodiments, in the discharging period, the method further includes controlling the pull-up sub-circuit in the n-th shift register unit by the high potential level at the pull-up node in the n-th shift register unit to pull down a potential level at the output port in the n-th shift register unit by a low voltage clock signal from the clock input port in the n-th shift register unit. Referring to FIG. 5C and FIG. 6, in the discharging period, the clock signals CLK1, CLK2, and CLK3 reverse to a low voltage level. In the discharging period, the potential levels of the pull-up nodes PU1, PU2, and PU3 remain at a high voltage level. Under the control of the high voltage levels at the pull-up node PU1, the pull-up node PU2, and the pull-up node PU3, respectively, the third transistor M3_1 in the pull-up sub-circuit 50_1 in the first shift register unit 100, the third transistor M3_2 in the pull-up sub-circuit 50_2 in the second shift register unit 200, and the third transistor M3_3 in the pull-up sub-circuit 50_3 in the third shift register unit 300, are turned on. The potential levels at the output ports OUTPUT1, OUTPUT2, and OUTPUT3 are pulled down to a low voltage level respectively by the low voltage clock signals CLK1, CLK2, and CLK3.

In the discharging period, under the control of the high voltage level at the pull-up node PU1, the sixth transistor M6 and the eighth transistor M8 in the single pull-down control sub-circuit 10 in the first shift register unit 100 remain turned on, potential levels at the pull-down node PD and the pull-down connection node PD_CN remain at low voltage levels. In one example, the potential level at the pull-down node PD remains at 0 V.

In some embodiments, in the reset period, the method further includes providing an output signal from an output port of a shift register unit in a (m+)-th group of shift register units as a reset signal to a reset port (e.g., the single reset port) in the m-th group of shift register units, controlling the reset sub-circuit in the n-th shift register unit by the reset signal to pull down potential levels at the pull-up node and the output port in the n-th shift register unit to a low voltage level, providing a high voltage at the single high-voltage port, and controlling the single pull-down control sub-circuit by the high voltage at the single high-voltage port to pull up a potential level at the pull-down node to a high voltage level.

Referring to FIG. 2, the single reset port RESET in the m-th group of shift register units Gm is configured to receive an output signal from an output port OUTPUT2 of a second shift register unit in a (m+1)-th group of shift register units Gm+1 as a reset signal. Referring to FIG. 5D, the reset signal is provided to the second transistor M2_1 in the reset sub-circuit 30_1 in the first shift register unit 100, the second transistor M2_2 in the reset sub-circuit 30_2 in the second shift register unit 200, and the second transistor M2_3 in the reset sub-circuit 30_3 in the third shift register unit 300, respectively. The second transistor M2_1, the second transistor M2_2, and the second transistor M2_3 are turned on by the reset signal.

Referring to FIG. 7, the potential levels at the pull-up node PU1 and the output port OUTPUT1 in the first shift register unit 100, the pull-up node PU2 and the output port OUTPUT2 in the second shift register unit 200, and the pull-up node PU3 and the output port OUTPUT3 in the third shift register unit 300, are pulled down to a low voltage level.

Because the potential levels at the pull-up node PU1 is pulled down to the low voltage level, the sixth transistor M6 and the eighth transistor MS are turned off. Referring to FIG. 5D, a high voltage is provided at the single high-voltage port VDD, turning on the ninth transistor M9 and the fifth transistor MS in the single pull-down control sub-circuit 10. The potential level at the pull-down node PD is pulled up to a high voltage level. Under the control of the high voltage level at the pull-down node PD, the tenth transistor M10_1 and the eleventh transistor M11_1 in the noise reduction sub-circuit 40_1 in the first shift register unit 100, the tenth transistor M10_2 and the eleventh transistor M11_2 in the noise reduction sub-circuit 40_2 in the second shift register unit 200, and the tenth transistor M10_3 and the eleventh transistor M1_3 in the noise reduction sub-circuit 40_3 in the third shift register unit 300, are turned on. The potential levels at the pull-up node PU1 and the output port OUTPUT1 in the first shift register unit 100, the pull-up node PU2 and the output port OUTPUT2 in the second shift register unit 200, and the pull-up node PU3 and the output port OUTPUT3 in the third shift register unit 300, are reset to a low voltage level.

Figure 5E:
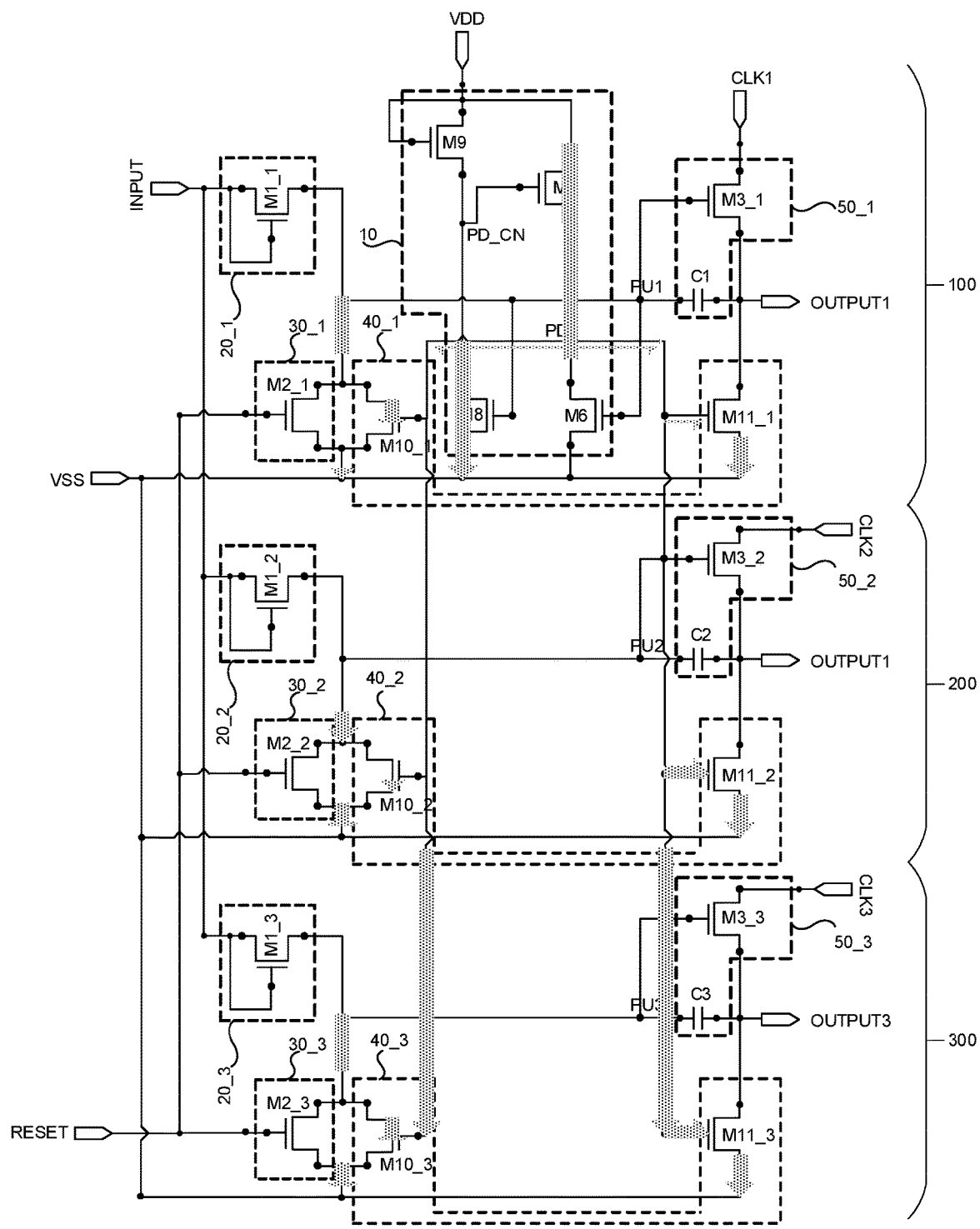
FIG. 5E illustrates the group of shift register units of FIG. 1 operated in a maintaining period of a display cycle in some embodiments according to the present disclosure.

In some embodiments, in the maintaining period, the method further includes maintaining the potential levels at the pull-up node and the output port in the n-th shift register unit at the low voltage level, and maintaining the potential level at the pull-down node at the high voltage level. FIG. 5E illustrates the group of shift register units of FIG. 1 operated in a maintaining period of a display cycle in some embodiments according to the present disclosure. Referring to FIG. 5E, in the maintaining period, the potential levels at the pull-up node PU1, the pull-up node PU2, and the pull-up node PU3 are maintained at a low voltage level, and the sixth transistor M6 and the eighth transistor M8 remain turned off. The potential level at the pull-down node PD is maintained at a high voltage level, the tenth transistor M10_1 and the eleventh transistor M11_1 in the noise reduction sub-circuit 40_1 in the first shift register unit 100, the tenth transistor M10_2 and the eleventh transistor M11_2 in the noise reduction sub-circuit 40_2 in the second shift register unit 200, and the tenth transistor M10_3 and the eleventh transistor M11_3 in the noise reduction sub-circuit 40_3 in the third shift register unit 300, remain turned on, continuing discharging the pull-up node PU1 and the output port OUTPUT1 in the first shift register unit 100, the pull-up node PU2 and the output port OUTPUT2 in the second shift register unit 200, and the pull-up node PU3 and the output port OUTPUT3 in the third shift register unit 300.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A gate driving circuit, comprising multiple shift register units cascaded one after another in multiple stages, wherein the multiple shift register units are grouped into a plurality of groups of shift register units, each of the plurality of groups of shift register units comprising a plurality of shift register units;

wherein each of the plurality of groups of shift register units comprises a single pull-down control sub-circuit;

wherein the plurality of groups of shift register units comprise M numbers of groups of shift register units sequentially in an order from m=1 to m=M, 1≤m≤M, M is greater than or equal to 2;

a m-th group of shift register units comprises N numbers of shift register units cascaded in series for respectively outputting N numbers of gate scanning signals to respective N numbers of gate lines of a display panel sequentially in an order from n=1 to n=N, wherein 1≤n≤N, N is greater than or equal to 2;

one or more input ports connected to the N numbers of shift register units are configured to receive an input signal;

one or more reset ports connected to the N numbers of shift register units are configured to receive an output signal from an output port of a shift register unit in a (m+1)-th group of shift register units as a reset signal; and the single pull-down control sub-circuit is connected to a pull-up node in a first shift register unit of the N numbers of shift register units;

wherein the single pull-down control sub-circuit comprises:

a ninth transistor having a gate and a first terminal commonly connected to a single high-voltage port, and a second terminal connected to a pull-down connection node;

a fifth transistor having a gate connected to the pull-down connection node, a first terminal connected to the single high-voltage port, and a second terminal connected to a pull-down node in the first shift register unit of the N numbers of shift register units;

an eighth transistor having a gate connected to the pull-up node in the first shift register unit of the N numbers of shift register units, a first terminal connected to the pull-down connection node, and a second terminal connected to a first low-voltage port; and a sixth transistor having a gate connected to the pull-up node in the first shift register unit of the N numbers of shift register units, a first terminal connected to the pull-down node in the first shift register unit of the N numbers of shift register units, and a second terminal connected to the first low-voltage port.

2. The gate driving circuit of claim 1, wherein the single pull-down control sub-circuit is connected to the single high-voltage port, the pull-down node, a pull-up node, and the first low-voltage port; and the single pull-down control sub-circuit is configured to be controlled by a potential level at the pull-up node to pull down a potential level at the pull-down node to a low voltage level.

3. The gate driving circuit of claim 1, wherein the input signal is an output signal from an output port of a first shift register unit in a (m−1)-th group of shift register units.

4. The gate driving circuit of claim 1, wherein the first shift register unit of the N numbers of shift register units is a first stage of the multiple shift register units; and
the input signal is a start signal.

5. The gate driving circuit of claim 1, wherein each of the N numbers of shift register units comprises a pull-up control sub-circuit; and
the pull-up control sub-circuit in a n-th shift register unit of the N numbers of shift register units comprises a first transistor having a gate and a first terminal commonly connected to an input port configured to receive the input signal, and a second terminal connected to the pull-up node in the n-th shift register unit.

6. The gate driving circuit of claim 1, wherein each of the plurality of groups of shift register units comprises a single input port and a single pull-up control sub-circuit; and
the single pull-up control sub-circuit comprises a first transistor having a gate and a first terminal commonly connected the single input port configured to receive the input signal, and a second terminal connected to pull-up nodes in the N numbers of shift register units.

7. The gate driving circuit of claim 1, wherein each of the N numbers of shift register units comprises a reset sub-circuit;
the reset sub-circuit in a n-th shift register unit of the N numbers of shift register units is connected to a reset port configured to receive the reset signal, a low-voltage port, and the pull-up node in the n-th shift register unit, and configured to pull down potential levels at the pull-up node in the n-th shift register unit to a low voltage level; and
the reset sub-circuit in the n-th shift register unit comprises a second transistor having a gate connected to the reset port, a first terminal connected to the pull-up node in the n-th shift register unit, and a second terminal connected to the low-voltage port.

8. The gate driving circuit of claim 1, wherein each of the N numbers of shift register units comprises a noise reduction sub-circuit;
the noise reduction sub-circuit in a n-th shift register unit of the N numbers of shift register units comprises:
a tenth transistor having a gate connected to the pull-down node in the first shift register unit of the N numbers of shift register units, a first terminal connected to the pull-up node in the n-th shift register unit, and a second terminal connected to a low-voltage port; and
an eleventh transistor having a gate connected to the pull-down node in the first shift register unit of the N numbers of shift register units, a first terminal connected to an output port in the n-th shift register unit, and a second terminal connected to the low-voltage port.

9. The gate driving circuit of claim 1, wherein each of the N numbers of shift register units comprises a pull-up sub-circuit;
the pull-up sub-circuit in a n-th shift register unit of the N numbers of shift register units comprises a third transistor and a capacitor, the third transistor having a gate connected to the pull-up node in the n-th shift register unit, a first terminal connected to a clock input port in the n-th shift register unit, and a second terminal connected to an output port in the n-th shift register unit, the capacitor having first terminal connected to the pull-up node in the n-th shift register unit and a second terminal connected to the output port in the n-th shift register unit; and the pull-up sub-circuit is configured to be controlled by a potential level at the pull-up node in the n-th shift register unit to output a clock signal from the clock input port in the n-th shift register unit to the output port in the n-th shift register unit.

10. The gate driving circuit of claim 1, wherein 2≤N≤5.

11. The gate driving circuit of claim 1, wherein N=3;
each group of the plurality of groups of shift register units comprises a first shift register unit, a second shift register unit, and a third shift register unit; and
the one or more reset ports are configured to receive an output signal from an output port of the second shift register unit in a (m+1)-th group of shift register units as a reset signal.

12. A display apparatus, comprising the gate driving circuit of claim 1.

13. A method of driving a gate driving circuit of claim 1 for respectively generating multiple gate driving signals at respective output ports of multiple shift register units in a plurality of image display cycles;
wherein each display cycle includes sequentially a charging period, an output period, a discharging period, a reset period, and a maintaining period; and
the single pull-down control sub-circuit is connected to a single high-voltage port, a pull-down node, a pull-up node, and a low-voltage port;
the method comprising:
providing an input signal to the plurality of groups of shift register units through one or more input ports in the charging period;
providing a reset signal to the plurality of groups of shift register units through one or more reset port in the reset period;
controlling the pull-up node to be at a high potential level; and
controlling the single pull-down control sub-circuit by potential level at the pull-up node, to pull down a potential level at the pull-down node to a low voltage level;
wherein the plurality of groups of shift register units comprise M numbers of groups of shift register units sequentially in an order from m=1 to m=M, 1≤m≤M, M is greater than or equal to 2;
a m-th group of shift register units comprises N numbers of shift register units cascaded in series for respectively outputting N numbers of gate scanning signals to respective N numbers of gate lines of a display panel sequentially in an order from n=1 to n=N, wherein 1≤n≤N, N is greater than or equal to 2;
the single pull-down control sub-circuit is connected to the pull-up node in a first shift register unit of the N numbers of shift register units; and
providing the reset signal to the plurality of groups of shift register units through the one or more reset ports in the reset period comprises providing an output signal from an output port of a shift register unit in a (m+1)-th group of shift register units as the reset signal to the plurality of groups of shift register units through the one or more reset ports in the reset period;
wherein each of the N numbers of shift register units comprises a pull-up control sub-circuit, a reset sub-circuit, a noise reduction sub-circuit, and a pull-up sub-circuit;
the pull-up control sub-circuit in a n-th shift register unit of the N numbers of shift register units comprises a first transistor having a gate and a first terminal commonly connected to an input port configured to receive the input signal, and a second terminal connected to the pull-up node in the n-th shift register unit;

the reset sub-circuit in a n-th shift register unit of the N numbers of shift register units comprises a second transistor having a gate connected to a reset port configured to receive the reset signal, a first terminal connected to the pull-up node in the n-th shift register unit, and a second terminal connected to a low-voltage port;

the single pull-down control sub-circuit comprises a ninth transistor having a gate and a first terminal commonly connected to the single high-voltage port, and a second terminal connected to a pull-down connection node, a fifth transistor having a gate connected to the pull-down connection node, a first terminal connected to the single high-voltage port, and a second terminal connected to the pull-down node in the first shift register unit of the N numbers of shift register units, an eighth transistor having a gate connected to the pull-up node in the first shift register unit of the N numbers of shift register units, a first terminal connected to the pull-down connection node, and a second terminal connected to a first low-voltage port, and a sixth transistor having a gate connected to the pull-up node in the first shift register unit of the N numbers of shift register units, a first terminal connected to the pull-down node in the first shift register unit of the N numbers of shift register units, and a second terminal connected to the first low-voltage port;

the noise reduction sub-circuit in a n-th shift register unit of the N numbers of shift register units comprises a tenth transistor having a gate connected to the pull-down node in the first shift register unit of the N numbers of shift register units, a first terminal connected to the pull-up node in the n-th shift register unit, and a second terminal connected to the low-voltage port, and an eleventh transistor having a gate connected to the pull-down node in the first shift register unit of the N numbers of shift register units, a first terminal connected to an output port in the n-th shift register unit, and a second terminal connected to the low-voltage port; and the pull-up sub-circuit in a n-th shift register unit of the N numbers of shift register units comprises a third transistor and a capacitor, the third transistor having a gate connected to the pull-up node in the n-th shift register unit, a first terminal connected to a clock input port in the n-th shift register unit, and a second terminal connected to an output port in the n-th shift register unit, the capacitor having first terminal connected to the pull-up node in the n-th shift register unit and a second terminal connected to the output port in the n-th shift register unit;

the method further comprises:

in the charging period, providing the input signal to the n-th shift register unit through an input port to control the pull-up control sub-circuit in the n-th shift register unit to output a high voltage to the pull-up node in the n-th shift register unit, and controlling the single pull-down control sub-circuit to pull down potential levels at the pull-down node and the pull-down connection node;

in the output period, controlling the pull-up sub-circuit in the n-th shift register unit by a high potential level at the pull-up node in the n-th shift register unit to output a high voltage clock signal from the clock input port in the n-th shift register unit to the output port in the n-th shift register unit, and outputting an output signal from the output port in a first shift register unit in the m-th group of shift register units to an input port in a first shift register unit in the (m+1)-th group of shift register units to start the charging period in the (m+1)-th group of shift register units;

in the discharging period, controlling the pull-up sub-circuit in the n-th shift register unit by the high potential level at the pull-up node in the n-th shift register unit to pull down a potential level at the output port in the n-th shift register unit by a low voltage clock signal from the clock input port in the n-th shift register unit;

in the reset period, providing an output signal from an output port of a shift register unit in a (m+1)-th group of shift register units as a reset signal to a reset port in the m-th group of shift register units, controlling the reset sub-circuit in the n-th shift register unit by the reset signal to pull down potential levels at the pull-up node and the output port in the n-th shift register unit to a low voltage level, providing a high voltage at the single high-voltage port, and controlling the single pull-down control sub-circuit by the high voltage at the single high-voltage port to pull up a potential level at the pull-down node to a high voltage level; and in the maintaining period, maintaining the potential levels at the pull-up node and the output port in the n-th shift register unit at the low voltage level, and maintaining the potential level at the pull-down node at the high voltage level.

14. The method of claim 13, wherein providing the input signal to the plurality of groups of shift register units through the one or more input ports in the charging period comprises providing an output signal from an output port of a shift register unit in a (m−1)-th group of shift register units as the input signal to plurality of groups of shift register units through the one or more input ports in the charging period.

15. The method of claim 13, wherein the first shift register unit of the N numbers of shift register units is a first stage of the multiple shift register units; and providing the input signal to the plurality of groups of shift register units through the one or more input ports in the charging period comprises providing a start signal as the input signal to the plurality of groups of shift register units through the one or more input ports in the charging period.

16. The method of claim 13, in the output period, the high potential level at the pull-up node in the n-th shift register unit is a potential level bootstrapped by the capacitor in the n-th shift register unit;

pull-up nodes in the N numbers of shift register units in the m-th group of shift register units are sequentially and non-simultaneously bootstrapped one by one; and high voltage clock signals are outputted from output ports in the N numbers of shift register units in the m-th group of shift register units sequentially and non-simultaneously.

\* \* \* \* \*